United States Patent [19]

Farjad-Rad et al.

[11] Patent Number: 5,799,048
[45] Date of Patent: Aug. 25, 1998

[54] PHASE DETECTOR FOR CLOCK SYNCHRONIZATION AND RECOVERY

[75] Inventors: Ramin Farjad-Rad, Stanford; Robert J. Drost, Palo Alto, both of Calif.

[73] Assignee: Sun Microsystems, Inc., Palo Alto, Calif.

[21] Appl. No.: 633,986

[22] Filed: Apr. 17, 1996

[51] Int. Cl.$^6$ ................................................ H04L 7/02
[52] U.S. Cl. .................... 375/360; 375/374; 327/144; 327/157; 327/159; 331/17
[58] Field of Search ........................ 375/374, 373, 375/371, 359, 234, 354, 360, 376, 236, 355; 327/141, 12, 144, 146, 151, 147, 148, 149, 152, 153, 157, 158, 159, 160; 371/2.1, 5.1, 5.3, 5.4; 331/17, 1

[56] References Cited

U.S. PATENT DOCUMENTS

| | | | |
|---|---|---|---|
| 4,222,009 | 9/1980 | Moulton et al. | 327/20 |
| 4,227,251 | 10/1980 | Kazama et al. | 375/360 |
| 4,305,045 | 12/1981 | Metz et al. | 331/1 A |
| 4,371,974 | 2/1983 | Dugan | 375/328 |
| 4,380,815 | 4/1983 | Clendening | 375/327 |
| 4,400,667 | 8/1983 | Belkin | 331/1 A |
| 4,400,817 | 8/1983 | Summer | 375/373 |
| 4,535,459 | 8/1985 | Hogge, Jr. | 375/80 |

OTHER PUBLICATIONS

Hogge, Jr., "A Self Correcting Clock Recovery Circuit", Journal of Lightwave Technology vol. LT-3, No. 6, Dec. 1985.

Lee, "A 155-MHz Clock Recovery Delay- and Phase--Locked Loop", IEEE Journal of Solid-State Circuits, vol. 27, No. 12, Dec. 1992.

*Primary Examiner*—Wellington Chin
*Assistant Examiner*—William Luther
*Attorney, Agent, or Firm*—Skjerven, Morrill, MacPherson, Franklin & Friel LLP; Forrest E. Gunnison

[57] ABSTRACT

A clock recovery circuit employing a phase-locked loop design includes an N-to-1 multiplexer (MUX) coupled to a series of N latches which allows data to sampled at a frequency N times that of the clock. Incoming data is latched by each of the N latches, where each latch is clocked at a different phase of the clock signal such that the phase of the clock provided to the nth latch is shifted nT/N, where T is the period of the clock and n is an integer from 1 to N. The output terminals of the series of N latches are coupled to associated ones of input terminals of the N-to-1 MUX. The selection of MUX input terminals is controlled by the clock signal such that the incoming data signal is reconstructed at the output terminal of the MUX. In this manner, the incoming data signal is effectively sampled at N times the clock speed.

18 Claims, 6 Drawing Sheets

PHASE DETECTOR FOR CLOCK SYNCHRONIZATION AND RECOVERY

BACKGROUND

1. Field of the Invention

The present invention relates generally to phase detectors and specifically to phase detectors employing a reduced frequency oscillator.

1. Description of Related Art

Figure 1:
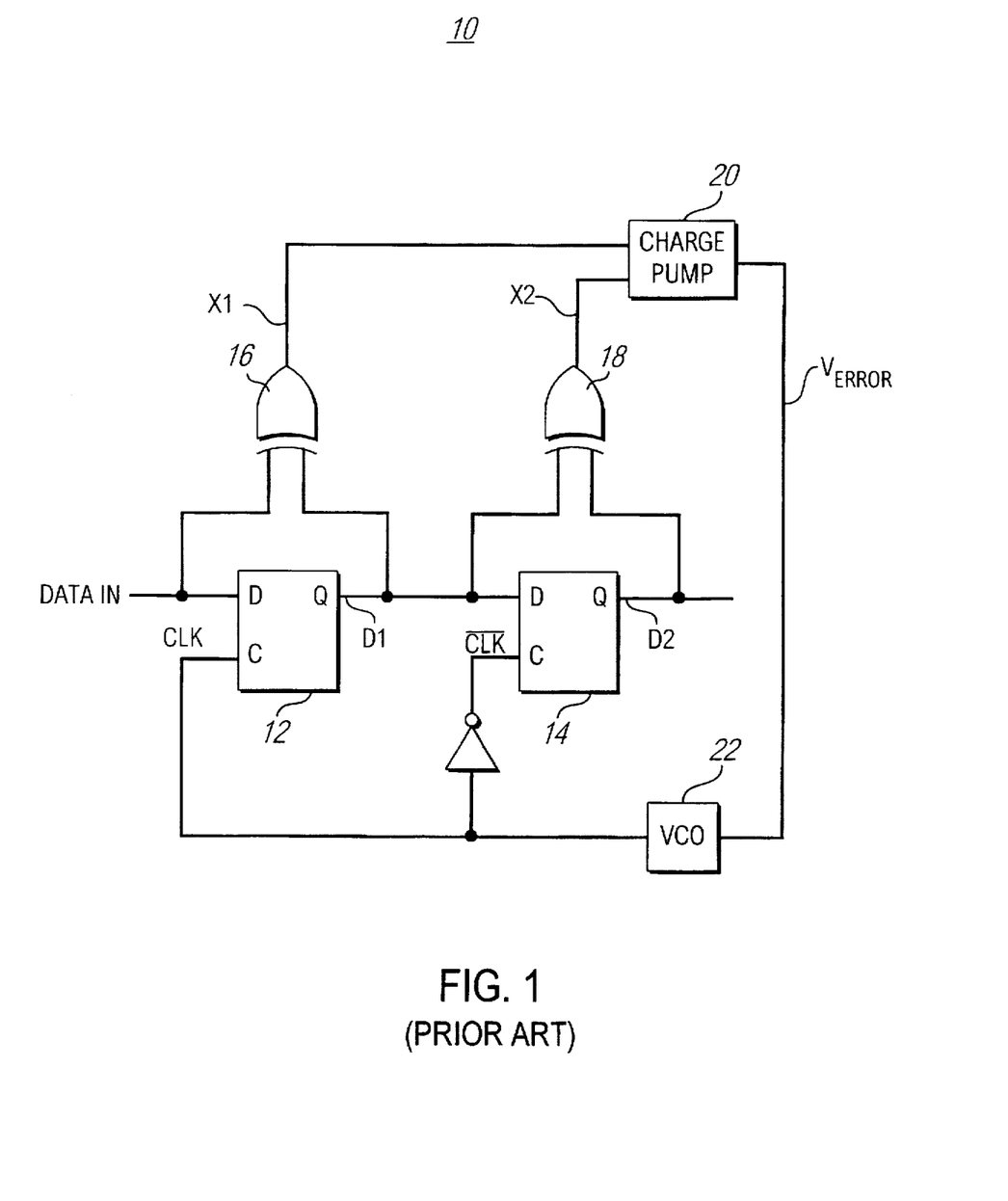
FIG. 1 is a schematic diagram of a conventional clock recovery circuit employing a phase-locked loop design.

In the transmission of digital information, data bits are transmitted at a predetermined clock frequency. The data signal is then sample to "recover" the clock signal. FIG. 1 shows a conventional clock recovery circuit 10 having a phase-locked loop (PLL) design which adjusts the recovered clock CLK so as to be phase aligned with the received data signal DATA. It is important that clock signal CLK and signal DATA are properly aligned, e.g. phase-locked, to avoid loss of data. Ideally, the rising edge of clock signal CLK should be positioned at the center of each bit interval of signal DATA.

The received data signal DATA is latched by a D-type latch 12 on the rising edge of clock signal CLK, where the Q output of latch 12, hereinafter denoted D1, is equal to signal DATA delayed by one-half cycle of clock signal CLK. This delayed signal D1 is then latched by D-type latch 14 on the rising edge of the inverted clock signal $\overline{CLK}$. The Q output of latch 14, hereinafter denoted D2, is equal to signal D1 delayed by one-half cycle of clock signal $\overline{CLK}$.

Signal DATA and delayed signal D1 are passed through an exclusive-or (XOR) gate 16 to produce a control signal X1 which transitions high when signal DATA and D1 are of different logic states. The width of such logic high transitions of signal X1 depends upon the particular positioning of the rising edge of clock signal CLK with respect to the bit interval of signal DATA, as will be explained below.

Delayed signals D1 and D2 are passed through XOR gate 18 to produce a reference signal X2 which transitions logic high when signal D1 and D2 are of different logic states. Note that since signals D1 and D2 are the Q outputs of latches 12 and 14, respectively, which are clocked by CLK and clock signal $\overline{CLK}$, respectively, the phase delay between signals D1 and D2 is constant. Accordingly, the widths of the logic high transitions of signal X2 are a constant fraction of the period T of clock signal CLK time. In this manner, control signal X1 may be compared with reference signal X2 to determine whether signal DATA is properly aligned with clock signal CLK.

In the circuit of FIG. 1 signals X1 and X2 are inputs to a charge pump circuit 20 that, in response thereto, produces an error voltage $V_{error}$. High transitions of signal X1 increase error voltage $V_{error}$ while high transitions of signal X2 decrease error voltage $V_{error}$. Thus, charge pump circuit 20, which may be of any suitable conventional design, essentially sums and integrates signals X1 and X2 to produce signal $V_{error}$. Error voltage $V_{error}$ is provided as an input to a conventional voltage-controlled oscillator (VCO) 22 which, in response thereto, adjusts the phase and/or frequency of the clock signal CLK.

When clock signal CLK is properly aligned with signal DATA, the high transition widths of signals X1 and X2 will be identical. In such a case, charge pump circuit 20 will maintain error voltage $V_{error}$ at a constant value so as to cause VCO 22 to maintain the present frequency and phase of clock signal CLK. If, however, clock signal CLK is not properly aligned with signal DATA, the widths of the high transitions of signals X1 and X2 will differ. In response thereto, charge pump circuit 20 will alter error voltage $V_{error}$ so that VCO 22 adjusts clock signal CLK until properly aligned with signal DATA.

Figure 2:
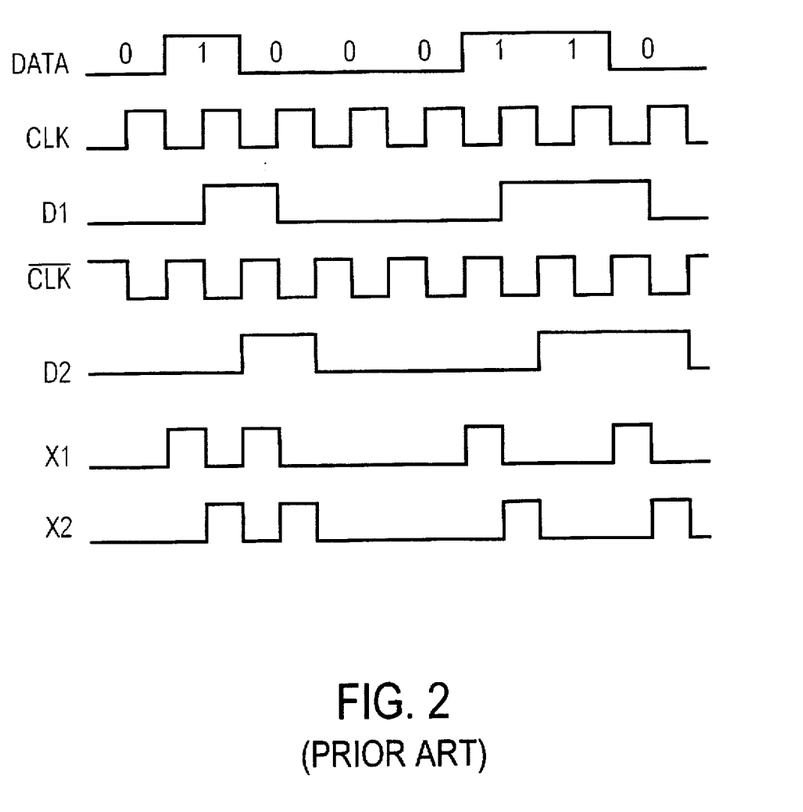
FIG. 2 is a timing diagram for an arbitrary data signal provided to the circuit of FIG. 1.

FIG. 2 shows the timing diagram for an arbitrary data signal DATA that is in proper alignment with the rising edge of the clock signal CLK. Note that the width of signal X1 will be equal to one-half cycle of clock signal CLK when clock signal CLK and DATA are properly aligned. The width of signal X2 will always be equal to one-half cycle of clock signal CLK, irrespective of whether clock signal CLK and DATA are properly aligned. Since in this case the widths of the logic high transitions of respective signals X1 and X2 are equal, the resultant error voltage $V_{error}$ should remain constant. In response thereto, VCO 22 should maintain a constant frequency clock signal CLK.

If, however, clock signal CLK is advanced relative to the center of the bit interval of signal DATA, the width of the logic high transitions of signal X1 becomes more narrow, while that of signal X2 remains constant. Such a discrepancy between the high transitions widths of signals X1 and X2 causes a negative shift in the error voltage $V_{error}$. In response thereto, VCO 22 retards clock signal CLK until error voltage $V_{error}$ returns to its original constant value, thereby aligning clock signal CLK with signal DATA. Similarly, if CLK is retarded with respect to signal DATA, the width of the logic high transitions of signal X1 becomes wider and causes a positive shift in error voltage $V_{error}$ which, in turn, causes VCO 22 to advance clock signal CLK until properly aligned with signal DATA.

The operation of the above-described clock recovery circuit may cause temporary undesirable phase errors in the clock signal CLK signal. Since the logic high transitions of respective signals X1 and X2 do not occur simultaneously but are rather phase-delayed with respect to each other, the $V_{error}$ signal provided to VCO 22 first experiences a positive shift resulting from the logic high transition of signal X1 and then experiences a negative shift resulting from the logic high transition of signal X2. Although error voltage $V_{error}$ is returned to its original constant value, (assuming of course that the width of transitions X1 and X2 are equal to one another), the sequential shifts in error voltage $V_{error}$ increase the average value of error voltage $V_{error}$. This increase in the average value of $V_{error}$, in turn, causes VCO 22 to alter the frequency of error signal CLK even where signal DATA and CLK are properly aligned. These resultant variations in the frequency of clock signal CLK, being dependent upon transitions in logic states of signal DATA, are commonly known as data dependent jitter and may lead to pedestal errors. It would thus be desirable to eliminate any such jitters from the operation of a clock recovery circuit.

It also would be desirable to form such a clock recovery circuit as a monolithic CMOS device due to the relative low cost of CMOS technology as compared to, for instance, bipolar technology. CMOS technology, however, is much slower than bipolar technology. As a result, it is very difficult to implement in CMOS technology stable clocks on the order of the one-GHz clocks typically required in digital data systems having data rates of 1 Gbps.

SUMMARY

A clock recovery circuit is disclosed herein which samples data at a rate N times that of a clock signal associated therewith. In accordance with the present invention, a clock recovery system employing a phase-locked loop design includes an N-to-1 multiplexer (MUX) coupled to a series of N latches. An incoming data signal is latched by each of the N latches, where each latch is clocked at a different phase of the clock signal such that the phase of the clock provided to the nth latch is shifted nT/N, where T is the period of the clock and n is an integer from 1 to N. The output leads of the series of N latches are coupled to associated ones of input terminals of the N-to-1 MUX. The selection of MUX inputs is controlled by the clock signal such that the incoming data signal is recovered at the output terminal of the MUX. In this manner, the incoming data signal is effectively sampled at N times the clock speed.

In some embodiments, the data signal and the recovered data signal are gated in a first XOR to produce a first signal, and a phase-delayed data signal and the recovered data signal are gated in a second XOR to produce a second signal. The first and second signals are then combined in a charge pump as described earlier to produce an error voltage which is used to adjust the clock signal so as to maintain proper alignment between the data signal and the clock signal. Logic high transitions of the first and second signals resulting from transitions in the data signal occur simultaneously and thus do not increase the average value of the error voltage. In this manner, data dependent jitter is greatly reduced.

DETAILED DESCRIPTION

Figure 3:
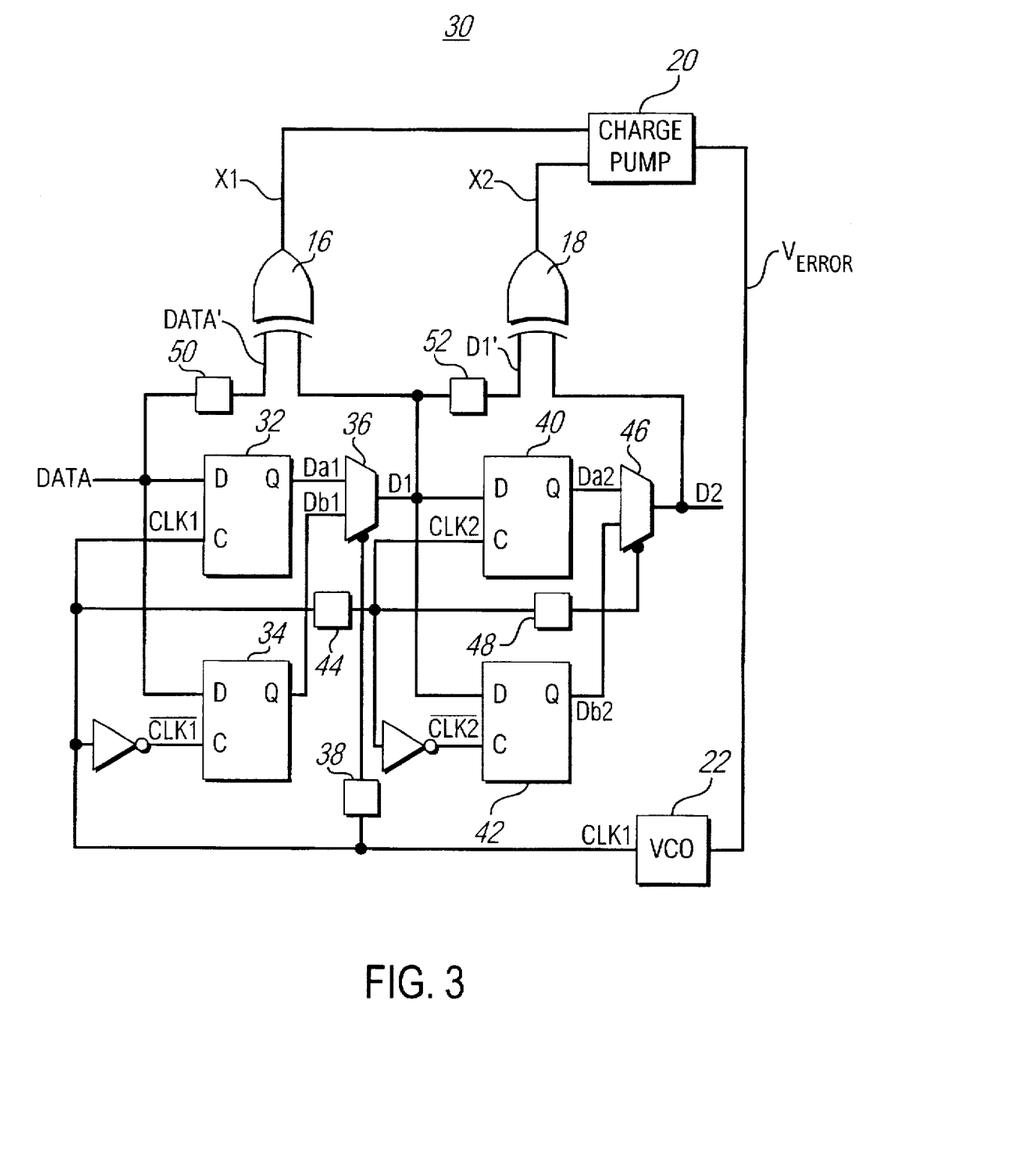
FIG. 3 is a schematic diagram of one embodiment in accordance with the present invention.

FIG. 3 shows a clock recovery circuit 30 in accordance with one embodiment of the present invention. Those components common to conventional circuit 10 and to embodiments in accordance with the present invention are appropriately labelled with the same numerals.

Figure 4:
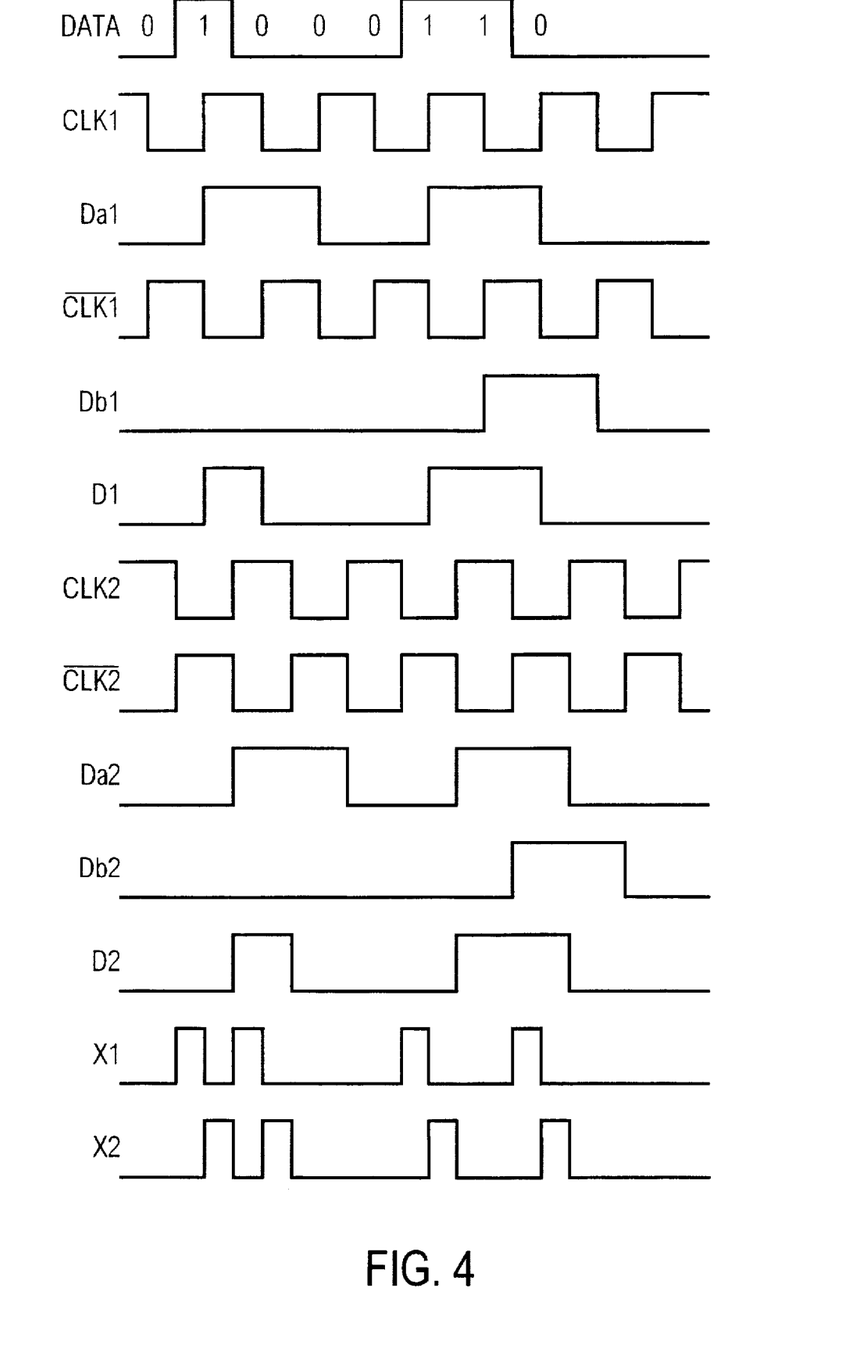
FIG. 4 is a timing diagram for an arbitrary data signal provided to the embodiment of FIG. 3.

Circuit 30 is shown in FIG. 3 to include two inputs latches 32 and 34 coupled to a 2:1 MUX 36 and, as will be explained in detail below, thereby allows an input data signal DATA to be sampled at a frequency equal to twice that of the clock signal CLK1. FIG. 4 is a timing diagram illustrating the operation of circuit 30 where signal DATA is of the bit pattern "01000110" and where clock signal CLK1 is properly aligned with the bit interval of signal DATA, i.e., the rising edge of clock signal CLK1 is positioned in the center of the bit interval of signal DATA.

It is to be understood, however, that in other embodiments additional input latches and a larger MUX may be employed to allow for sampling data at even greater multiples of the clock clock signal CLK1 frequency. Specifically, as will obvious to those skilled in the art after reading this specification, a series of N latches and an N-to-1 MUX may be utilized to allow data to be sampled at a frequency N times greater than the frequency of clock clock signal CLK1. The clock signal CLK1 provided to the N latches would be incrementally phase shifted by an amount nT/N, where T is the period of the signal CLK1 and n is an integer from 1 to N, using any well-known delay means. Thus, where for instance clock signal CLK1 is a 250 MHz signal and it is desired to sample data at a rate of 1 GHz (i.e., 1 Gbps), a 4-to-1 MUX and four latches would be required, the first latch being clocked by clock signal CLK1, the second latch being clocked by a T/4 phase-shifted clock signal CLK1, the third latch being clocked by a T/2 phase-shifted clock signal CLK1, and the fourth latch being clocked by a 3T/4 phase-shifted clock signal CLK1.

The operation of circuit 30, as shown in FIG. 3, is as follows. Input signal DATA is latched by D-type latches 32 and 34 on the rising edges of CLK1 and clock signal $\overline{CLK1}$, respectively. The Q output terminals of latches 32 and 34 carry respective signals Da1 and Db1 which are multiplexed in 2:1 MUX 36 to produce signal D1. Since signals Da1 and Db1 are generated by latching signal DATA on the rising edges of clock signal CLK1 and $\overline{CLK1}$, respectively, both of which are of a frequency equal to one-half the data rate of signal DATA, signals Da1 and Db1 represent alternating bits of signal DATA. In this manner, the bit pattern of DATA is recovered as signal D1 at the output lead of MUX 36 by using clock signal CLK1 to select which of latched signals Da1 and Db1 passes through MUX 36 to form signal D1.

Clock signal CLK1 is gated through a conventional delay circuit 38 having a delay equal to that of each of latches 32 and 34 before being coupled to the control terminal of MUX 36. Signal DATA is gated through a conventional delay circuit 50 having a delay equal to the sum of the respective delays of latch 32 and MUX 36 to provide a delayed data signal DATA'. Signals DATA' and D1 are gated together in XOR 16 to produce control signal X1.

Signal D1 is also latched by D-type latches 40 and 42 which generate at the respective Q output terminals thereof signals Da2 and Db2. Signal CLK1 is delayed by an amount equal to the delays of latches 32/34 plus the delay of MUX 36 via a conventional delay circuit 44 to produce clock signal CLK2. Latches 40 and 42 are clocked by respective signals CLK2 and $\overline{CLK2}$ and thus latch alternating bits of signal D1. A 2:1 MUX 46 has input terminals coupled to receive signals Da2 and Db2. Clock signal CLK2 is delayed by a conventional delay circuit 48 having a delay equal to that of each of latches 40 and 42 and is provided to a control terminal of MUX 46. In this manner, MUX 46 recovers signal D1 from latched signals Da2 and Db2 to produce a signal D2. It should be noted that, assuming no gate delays in circuit 30, since both signals D1 and D2 are signals which are constructed using versions of the same clock signal CLK1, signals D1 and D2 are replicas of another and the phase delay therebetween is necessarily constant.

Signal D1 is delayed via a conventional delay circuit 52 having a delay equal to the sum of the delays of latch 40 and MUX 46 to produce signal D1'. Signals D1' and D2 are gated together in XOR 18 to produce reference signal X2. Note that although XOR gates 16 and 18 are employed in the embodiment of FIG. 3 to generate signals X1 and X2, respectively, signals X1 and X2 may be generated in any suitable manner so as to be indicative of the phase delays between signal DATA' and signal D1 and D1' and D2, respectively.

Signals X1 and X2 are then combined in charge pump circuit 20 to generate error voltage $V_{error}$. As described earlier with respect to prior art circuit 10 (FIG. 1), VCO 22 adjusts the phase of clock signal CLK1 in response to error voltage $V_{error}$ so as properly align clock signal CLK1 with signal DATA.

The relationships between the above-described signals are illustrated in FIG. 4. Note, however, that for simplicity the timing diagram of FIG. 4 does not take into account the gate delays of latches or of MUXs of circuit 30 and, thus, does not show gate-delayed signals DATA' and D1'.

The operation of circuit 30 is advantageous over that of prior art clock recovery circuit 10 since circuit 30 is able to sample signal DATA at twice the frequency of its extracted clock signal CLK1, thereby allowing a circuit 30 fabricated using CMOS technology to sample data at rates higher than previously possible. For instance, as discussed earlier, it is nearly impossible to implement a stable 1 GHz clock signal CLK1 using modern CMOS technology. In accordance with the present invention, however, circuit 30 (as shown in FIG. 3) is able to sample data at a rate of 1 GHz (i.e., 1 Gbps) using only a 500 MHz clock CLK1 and may thus be readily formed as a CMOS device. The ability to form circuit 30 using CMOS technology not only reduces fabrication costs but also allows for circuit 30 to be more easily implemented as part of a larger CMOS circuit. Further, as mentioned above, larger multiplexers and additional latches may be employed to realize even higher sampling frequencies without requiring a faster clock, thereby achieving further advantages over conventional clock recovery circuits.

The operation of circuit 30 does, however, suffer from the same data dependent jitter problems discussed above with respect to prior art circuit 10. As mentioned earlier, the relative phase delay between signals X1 and X2 causes an undesirable upward shift in the average value of error voltage $V_{error}$ which, in turn, results in undesirable variations in frequency of clock signal CLK1. As illustrated in FIG. 4, when the rising edge of clock signal CLK1 is properly centered with the bit interval of DATA, signals D1 and D2 are equal to signal signal DATA phase delayed by period T/4, and T/2, respectively. It is this relative phase delay between signals D1 and D2 which results in the relative phase delay between signals X1 and X2 and, hence, in data dependent jitter problems.

Figure 5:
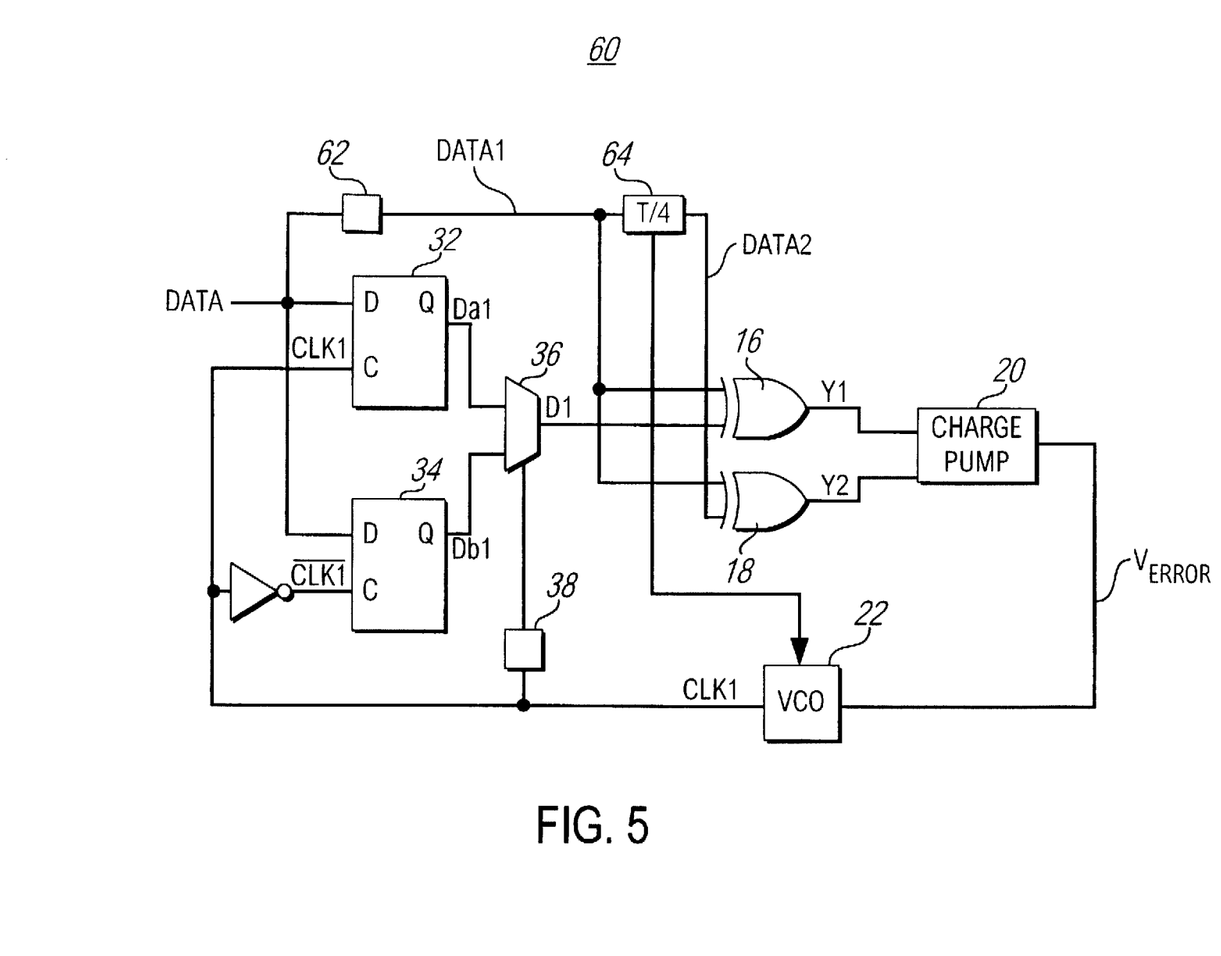
FIG. 5 is a schematic diagram of another embodiment in accordance with the present invention.

In another embodiment of the present invention, the phase relationship between signals DATA, D1, and D2 is utilized to create a simpler circuit design which greatly reduces data dependent jitter problems. Refer now to FIG. 5, where those components common to the embodiments exemplified in circuit 30 and circuit 60 are labelled with the same numerals. Data signal DATA is sampled by latches 32 and 34 and then recovered by MUX 36 to generate signal D1 in the manner described above with respect to circuit 30. Signal DATA is delayed by an amount equal to the sum of the gate delays of latch 32 and MUX 36 via a conventional delay circuit 62 to produce a data signal DATA1.

Signal DATA1 is delayed by an amount equal to period T/4, where time T is the period of signal CLK1, via a delay circuit 64 to produce a signal DATA2. Preferably, delay circuit 64 is identical to one of the delay stages of VCO 22 and is coupled to VCO 22 so that as VCO 22 adjusts signal CLK1, the period T/4 delay introduced by delay circuit 64 will be adjusted accordingly. Signal DATA2 is gated with signal DATA1 via XOR gate 18 to produce a reference signal Y2. Note that since the phase delay between signals DATA1 and signal DATA2 is constant, e.g., period T/4, the high transitions of signal Y2 will be of a constant width.

Signal DATA1 is gated with signal D1 via XOR gate 16 to produce a control signal Y1. The width of the high transitions of signal Y1 vary depending upon the relative phase difference between signal CLK1 and DATA. Signal Y1 may then be compared to reference signal Y2 to determine whether signal DATA is in alignment with signal CLK1. Although shown in FIG. 5 as being generated by XOR gates 16 and 18, respective signals Y1 and Y2 may be generated and combined in any suitable manner which is indicative of the phase delays signal DATA1 and D1 and signal DATA1 and DATA2.

Figure 6:
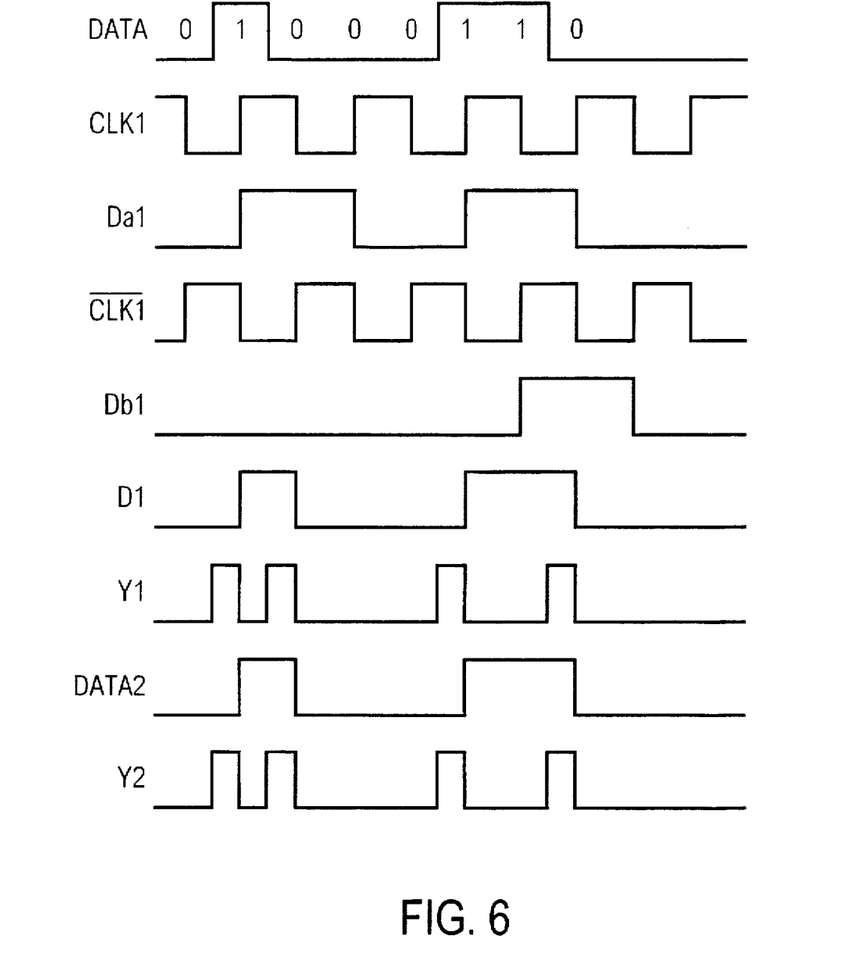
FIG. 6 is a timing diagram for an arbitrary data signal provided to the embodiment of FIG. 5.

As shown in the embodiment of FIG. 5, signals Y1 and Y2 are provided as input signals to conventional charge pump circuit 20 to produce error voltage $V_{error}'$. VCO 22 adjusts the phase of clock signal CLK1 in response to error voltage $V_{error}$ such that CLK1 is properly aligned with DATA. It is to be noted, however, that signals Y1 and Y2 may be combined to produce error voltage $V_{error}$ by any suitable means without departing from the scope of the present invention. Where clock signal CLK1 is properly aligned with signal DATA, as is the case for the arbitrary signal DATA bit pattern "01000110" upon which the timing diagram of FIG. 6 is based, the phase delay between signals signal DATA1 and D1 will be equal to period T/4. Since signal DATA2 is phase delayed period T/4 with respect to DATA1 via delay circuit 64, the widths of the high transitions of signals Y1 and Y2 will be equal to one another. Referring to the timing diagram of FIG. 6, note that when signal DATA is in alignment with clock signal CLK1, signals Y1 and Y2 are in phase with each other. Thus, signals Y1 and Y2, which charge and discharge charge pump circuit 20, respectively, effectively cancel each other so as not to cause an increase in the average value of error voltage $V_{error}'$. Accordingly, circuit 60 does not suffer from the data dependent jitter problems discussed earlier with respect to prior art circuit 10.

If, on the other hand, clock signal CLK1 drifts out of alignment with signal DATA, the widths of the high transitions of signal Y1 will differ from those of signal Y2, thereby resulting in a change in error voltage $V_{error}'$ which, in turn, will result in VCO 22 adjusting clock signal CLK1 until properly aligned with signal DATA.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of aligning a data signal with a clock signal, said method comprising the steps of:
   receiving a string of data bits of a first frequency at an input node;
   successively latching N of said string of data bits using N first latches;
   recovering said string of data bits as a first string of recovered data bits by multiplexing the outputs of said N first latches;
   generating a control signal indicative of the phase delay between said string of data bits and said first string of recovered data bits;
   generating a reference signal indicative of a predetermined phase delay;
   comparing said control signal to said reference signal to produce an error signal; and
   adjusting said clock signal in response to said error signal so as to be in alignment with said string of data bits.

2. The method of claim 1 wherein the successive latching of N of said data bits is controlled by said clock signal having a period of time T.

3. The method of claim 2 wherein the multiplexing of the outputs of said N first latches is controlled by said clock signal.

4. The method of claim 1 further comprising the step of:
causing each of said N first latches to successively latch said string of data bits at intervals of period T/N.

5. The method of claim 1 wherein the step of generating said control signal further comprises the step of:
exclusive-ORing said string of data bits with said first string of recovered data bits to generate said control signal.

6. The method of claim 5 wherein the step of generating said reference signal further comprises the steps of:
successively latching N of said first string of recovered data bits using N second latches;
recovering said first string of recovered data bits to produce a second string of recovered data bits by multiplexing the output signals of said N second latches; and
exclusive-ORing said first string of recovered data bits with said second string of recovered data bits to generate said reference signal.

7. The method of claim 5 wherein said step of generating said reference signal further comprises the steps of:
generating a phase-delayed string of data bits from said string of data bits; and
exclusive-ORing said string of data bits with said phase-delayed string of data bits to produce said reference signal.

8. The method of claim 7 wherein the phase delay is equal to period T/4.

9. A circuit for aligning a data signal with a clock signal, said circuit comprising:
N latches coupled to receive said data signal, wherein successive ones of said N latches are clocked at successive intervals of a period T of said clock signal so as to latch successive bits of said data signal;
a multiplexer coupled to receive said successive bits of said data signal, said multiplexer being controlled by said clock signal so as to provide a recovered data signal at an output terminal thereof;
means for generating a control signal indicative of the phase delay between said data signal and said recovered data signal;
means for generating a reference signal indicative of a predetermined phase delay;
means for comparing said said reference so said reference signal to produce an error signal; and
means for adjusting said clock signal in response to said error signal so as to be in alignment with said data signal.

10. The circuit of claim 9 wherein said means for adjusting comprises a voltage controlled frequency oscillator.

11. The circuit of claim 9 wherein said means for comparing comprises a charge pump.

12. The circuit of claim 9 wherein said means for generating a control signal comprises an exclusive-OR gate coupled to receive said data signal and said recovered data signal.

13. The circuit of claim 12 wherein said means for generating said reference signal comprises:
N second latches coupled to receive the first-mentioned recovered data signal, wherein successive ones of said second N latches are clocked at successive intervals of said period T of said clock signal so as to latch successive bits of said first recovered data signal;
a second multiplexer coupled to receive said successive bits of said first recovered data signal, said second multiplexer being controlled by said clock signal so as to provide a second recovered data signal at an output terminal thereof; and
an exclusive-OR gate coupled to receive said first recovered data signal and said second recovered data signal.

14. The method of claim 12 wherein said means for generating said reference signal comprises:
a delay circuit coupled to receive said data signal and providing a phase delayed data signal at an output terminals thereof; and
an exclusive-OR gate coupled to receive said data signal and said phase-delayed data signal.

15. The circuit of claim 14 wherein said delay circuit delays said data signal by period T/4.

16. A circuit for aligning a data signal and a clock signal, said circuit comprising:
an inverter coupled to receive said clock signal and providing an inverted clock signal;
first and second latches having a data input terminal coupled to receive said data signal and having an output terminal, said first latch being clocked by said clock signal and said second latch being clocked by said inverted clock signal;
a multiplexer having first and second input terminals coupled to said output terminals of said respective first and second latches, a control terminal coupled to receive said clock signal, and an output terminal for providing a recovered data signal;
a delay circuit coupled to receive said data signal and providing in response thereto a delayed data signal;
a first XOR gate coupled to receive said data signal and said recovered data signal, said first XOR gate generating a control signal at an output terminal thereof;
a second XOR gate coupled to receive said data signal and said delayed data signal, said second XOR gate generating a reference signal at an output terminal thereof; and
a charge pump coupled to receive said control signal and said reference signal and generating in response thereto an error signal, said clock signal being adjusted in response to said error signal such that said data signal is in alignment with said clock signal.

17. The circuit of claim 16, wherein said delay circuit delays said data signal by period T/4, where T is the period of said clock signal.

18. A circuit for aligning a data signal with a clock signal, said circuit comprising:
an inverter coupled to receive said clock signal thereby to provide an inverted clock signal;
first and second latches having a data input terminal coupled to receive said data signal and having an output terminal, said first latch being clocked by said clock signal and said second latch being clocked by said inverted clock signal;
a first multiplexer having, first and second input terminals coupled to said output terminals of said respective first and second latches, a control terminal coupled to receive said clock signal, and an output terminal for providing a first recovered data signal;
third and fourth latches having a data input terminal coupled to receive said first recovered data signal and having and an output terminal, said third latch being clocked by said clock signal and said fourth latch being clocked by said inverted clock signal;

a second multiplexer having first and second input terminals coupled to said output terminals of said respective third and fourth latches, a control terminal coupled to receive said clock signal, and an output terminal for providing a second recovered data signal;

a first XOR gate coupled to receive said data signal and said first recovered data signal, said first XOR gate generating a control signal at an output terminal thereof;

a second XOR gate coupled to receive said first recovered data signal and said second recovered data signal, said second XOR gate generating a reference signal at an output terminal thereof; and a charge pump coupled to receive said control signal and said reference signal and generating in response thereto an error signal, said clock signal being adjusted in response to said error signal such that said data signal is in alignment with said clock signal.

* * * * *